US012604396B2

(12) United States Patent
Huang et al.

(10) Patent No.: US 12,604,396 B2
(45) Date of Patent: Apr. 14, 2026

(54) DEVICE PANEL

(71) Applicant: AUO Corporation, Hsinchu (TW)

(72) Inventors: Zih-Shuo Huang, Hsinchu (TW);
Tsung-Ying Ke, Hsinchu (TW)

(73) Assignee: AUO Corporation, Hsinchu City (TW)

( * ) Notice: Subject to any disclaimer, the term of this
patent is extended or adjusted under 35
U.S.C. 154(b) by 253 days.

(21) Appl. No.: 18/536,122

(22) Filed: Dec. 11, 2023

(65) Prior Publication Data

US 2025/0048544 A1     Feb. 6, 2025

(30) Foreign Application Priority Data

Jul. 31, 2023     (TW) ................................. 112128589

(51) Int. Cl.
H05K 1/02          (2006.01)

(52) U.S. Cl.
CPC ... H05K 1/028 (2013.01); H05K 2201/09227
(2013.01)

(58) Field of Classification Search
CPC ..................... H05K 1/028; H05K 2201/09227
USPC ........................................................ 361/749
See application file for complete search history.

(56) References Cited

U.S. PATENT DOCUMENTS

| | | | | | |
|---|---|---|---|---|---|
| 12,041,718 | B2 * | 7/2024 | Wang | .................... | H05K 1/0283 |
| 12,111,699 | B2 * | 10/2024 | Min | ...................... | G06F 1/1601 |
| 2020/0144357 | A1 | 5/2020 | Park et al. | | |
| 2022/0310741 | A1 | 9/2022 | Wang | | |
| 2023/0144054 | A1 * | 5/2023 | Kim | ..................... | H10D 86/443 |
| | | | | | 345/59 |

FOREIGN PATENT DOCUMENTS

| | | |
|---|---|---|
| CN | 112397456 | 2/2021 |
| CN | 113690289 | 11/2021 |
| CN | 113436535 | 5/2022 |
| WO | 2020227936 | 11/2020 |

* cited by examiner

*Primary Examiner* — Binh B Tran
(74) *Attorney, Agent, or Firm* — JCIPRNET

(57)          ABSTRACT

A device panel includes a substrate, electronic devices, and
first signal lines. The substrate is provided with a first
bending area and a non-bending area outside the first bend-
ing area. The substrate is adaptable for bending along a first
bending line in the first bending area. The electronic devices
are disposed on the substrate, and include first electronic
devices located in the non-bending area and second elec-
tronic devices located in the first bending area. The first
signal lines extend in a first direction, and respectively
connect the electronic devices in series. The first bending
line is perpendicular to the first direction. Two junctions
between any one of the second electronic devices and one of
the first signal lines are located on two opposite sides of the
any one of the second electronic devices in an axial direction
of the first bending line.

16 Claims, 6 Drawing Sheets

DEVICE PANEL

CROSS-REFERENCE TO RELATED APPLICATION

This application claims the priority benefit of Taiwan application serial no. 112128589, filed on Jul. 31, 2023. The entirety of the above-mentioned patent application is hereby incorporated by reference herein and made a part of this specification.

BACKGROUND

Technical Field

The disclosure relates to a device panel, and more specifically, to a flexible device panel.

Related Art

Mobile electronic devices have significantly changed people's lifestyles, and devices such as smartphones, fitness bands, smartwatches, or wearable physiological signal detection devices for medical use have become ubiquitous. In pursuit of comfort in wearing/mounting or convenience in carrying, flexibility has gradually become one of the indispensable features of mobile electronic devices. However, in mobile electronic devices, in the case of either a display panel for display or a device panel for sensing, electrical properties may be affected due to a strain on display devices or sensing devices caused by signal lines when the mobile electronic device is bent.

SUMMARY

The disclosure provides a flexible device panel having improved reliability in electrical operation.

A device panel of the disclosure includes a substrate, a plurality of electronic devices, and a plurality of first signal lines. The substrate is provided with a first bending area and a non-bending area outside the first bending area. The substrate is adaptable for bending along a first bending line in the first bending area. The plurality of electronic devices are disposed on the substrate and include a plurality of first electronic devices disposed in the non-bending area, and a plurality of second electronic devices disposed in the first bending area. The plurality of first signal lines extend in a first direction and respectively connect the electronic devices in series. The first bending line is perpendicular to the first direction. Two junctions between any one of the second electronic devices and one of the first signal lines are located on two opposite sides of the any one of the second electronic devices in an axial direction of the first bending line.

Based on the above, when the device panel according to an embodiment of the disclosure is bent along the bending line, since the junctions between the electronic devices and the signal lines in the bending area are all located on two opposite sides of the electronic devices in the axial direction of the bending line, it is possible to significantly reduce the strain amount of the electronic devices resulting from pulling by the signal lines in the bending area to thus improve stability of the operational electrical properties of the device panel.

DESCRIPTION OF EMBODIMENTS

Figure 1:
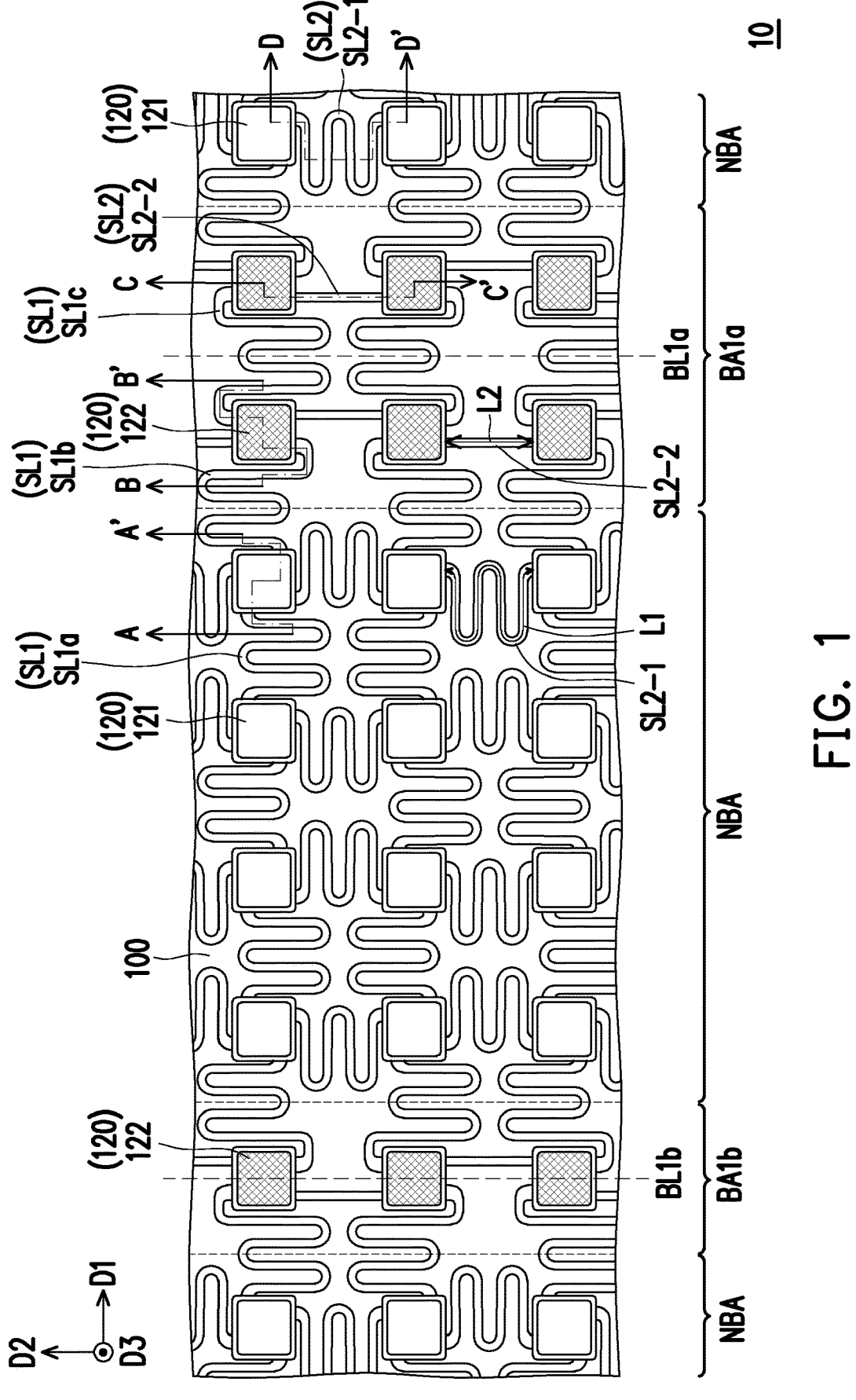
FIG. 1 is a schematic front view of a device panel according to a first embodiment of the disclosure.

The term "about," "approximately," "essentially," or "substantially" as used herein is inclusive of the stated value and a mean within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, $\pm 30\%$, $\pm 20\%$, $\pm 15\%$, $\pm 10\%$, or $\pm 5\%$ of the stated value. Moreover, a relatively acceptable range of deviation or standard deviation may be chosen for the term "about," "approximately," "essentially," or "substantially" as used herein based on measuring properties, cutting properties, or other properties, instead of applying one standard deviation across all the properties.

In the accompanying drawings, thicknesses of layers, films, panels, areas, etc. are exaggerated for clarity. It should be understood that when a device such as a layer, film, area, or substrate is referred to as being "on" or "connected to" another device, it may be directly on or connected to another device, or intervening devices may also be present. In contrast, when a device is referred to as being "directly on" or "directly connected to" another device, no intervening devices are present. As used herein, the term "connected" may refer to physical connection and/or electrical connection. Also, "electrical connection" may include a case in which other devices are present between two devices.

Moreover, relative terms such as "below" or "bottom" and "above" or "top" may serve to describe the relation between one component and another component herein as shown in the drawings. It should also be understood that the relative terms are intended to include different orientations of a device in addition to the orientation shown in the drawings. For example, if a device in the drawings is turned upside down, a component described as being "below" another component shall be re-orientated to be "above" the another component. Thus, the exemplary term "below" may include the orientations of "below" and "above", depending on the specific orientation of the drawings. Similarly, if a device in the drawings is turned upside down, a component described to be "under" or "below" another component shall be re-oriented to be "above" the another component. Therefore, the exemplary term "above" or "below" may include orientations of "above" and "below".

Exemplary embodiments will be described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. That is, the regions shown in the drawings are schematic in nature, and their shapes are not intended to show the exact shapes of the regions, and are not intended to limit the scope of the claims.

Reference will now be made in detail to exemplary embodiments provided in the disclosure, examples of which are illustrated in accompanying drawings. Wherever possible, identical reference signs are used in the drawings and descriptions to refer to identical or similar parts.

Figures 2A, 2B:
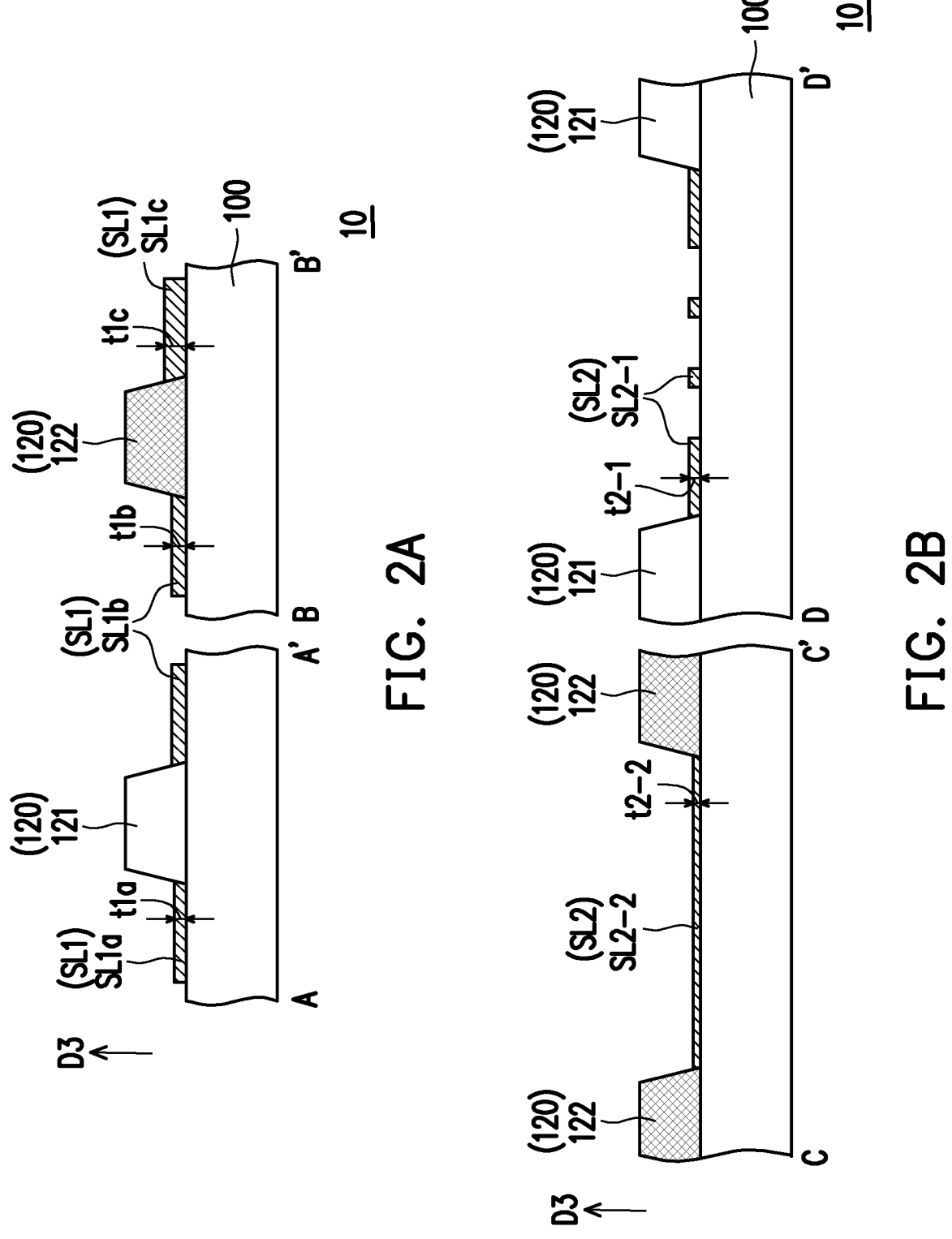
FIG. 2A and FIG. 2B are schematic cross-sectional views of the device panel in FIG. 1.
Figure 3:
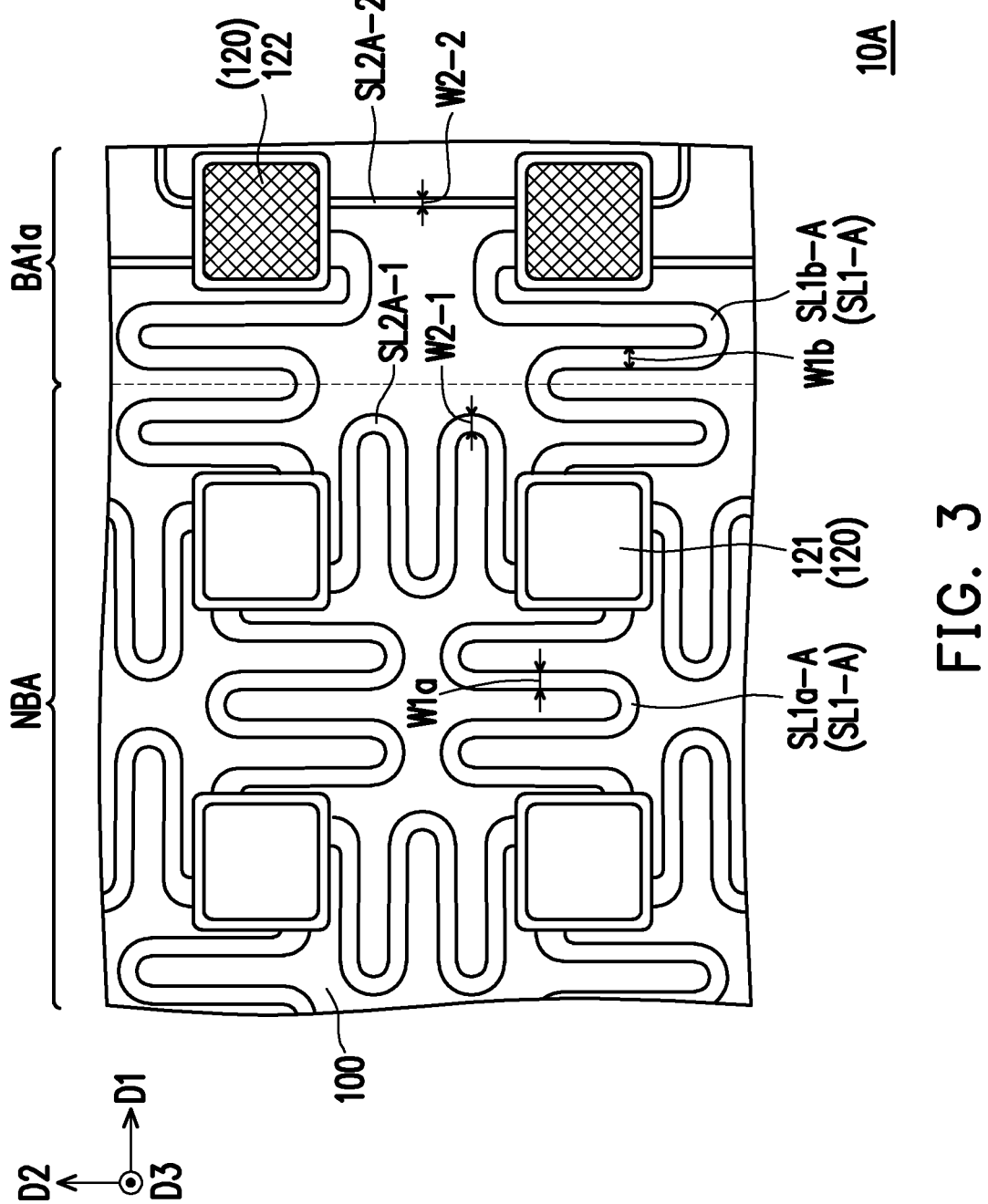
FIG. 3 is a schematic front view of another embodiment of the device panel in FIG. 1.

FIG. 1 is a schematic front view of a device panel according to a first embodiment of the disclosure. FIG. 2A and FIG. 2B are schematic cross-sectional views of the device panel in FIG. 1. FIG. 3 is a schematic front view of another embodiment of the device panel in FIG. 1. FIG. 2A corresponds to a sectional line A-A' and a sectional line B-B' in FIG. 1. FIG. 2B corresponds to a sectional line C-C' and a sectional line D-D' in FIG. 1. Referring to FIG. 1, a device panel 10 includes a substrate 100, a plurality of electronic devices 120, a plurality of first signal lines SL1, and a plurality of second signal lines SL2. The substrate 100 is provided with at least one bending area and a non-bending area NBA outside the bending area.

In this embodiment, the substrate 100 may have two bending areas (i.e., two first bending areas), respectively being a bending area BA1a and a bending area BA1b, and these two bending areas are arranged at an interval along a first direction D1. Specifically, the bending area BA1a and the bending area BA1b are each provided with a non-bending area NBA on two opposite sides in the first direction D1. The substrate 100 is adaptable for bending along a bending line BL1a (i.e., a first bending line) in the bending area BA1a, and bending along a bending line BL1b in the bending area BA1b. After bending, a minimum radius of curvature of the device panel 10 of this embodiment in the bending area may reach a scale of 100 micrometers.

For example, in this embodiment, the width (i.e., the width of a bendable range) of the bending area BA1a in the first direction D1 may be different from the width of another bending area BA1b in the first direction D1, but the disclosure is not limited thereto. In other embodiments, the bendable ranges of the two bending areas may also be different.

The substrate 100 is provided with a plurality of electronic devices 120, a plurality of first signal lines SL1, and a plurality of second signal lines SL2. In this embodiment, the plurality of first signal lines SL1 intersect (for example, but not limited thereto, being perpendicular to) the plurality of second signal lines SL2. For example, the plurality of first signal lines SL1 may be arranged along a second direction D2 and extend in the first direction D1. The plurality of second signal lines SL2 may be arranged along the first direction D1 and extend in the second direction D2. Herein, the first direction D1 may optionally be perpendicular to the second direction D2. In this embodiment, the signal lines are, for example, scan lines, data lines, or power lines, but are not limited thereto.

To satisfy the stretchable properties of the device panel 10, orthographic projections onto the substrate 100 of at least a part of the signal lines connecting the electronic devices 120 in series have substantially a bent shape. Herein, the orthographic projection refers to a projection of the signal line along a third direction D3 onto the substrate 100, and the third direction D3 is perpendicular to the first direction D1 and the second direction D2.

The plurality of electronic devices 120 may be connected in series by the plurality of first signal lines SL1 into multiple rows along the first direction D1, and connected in series by the plurality of second signal lines SL2 into multiple columns along the second direction D2. In this embodiment, each of the electronic devices 120 may be electrically connected to one first signal line SL1 and one second signal line SL2, but the disclosure not limited thereto.

For example, in this embodiment, the electronic device 120 may be a light-emitting device having self-luminous properties. The light-emitting device includes, for example, a pixel circuit (not shown) and at least one light-emitting element (not shown), but is not limited thereto. That is, the device panel 10 of this embodiment may be a display panel. However, in another embodiment, the electronic device 120 may also be a sensing device having light-sensing capabilities or other electronic devices having different functions, which is not particularly limited in the disclosure.

Furthermore, the plurality of electronic devices 120 may include a plurality of first electronic devices 121 disposed in the non-bending area NBA, and a plurality of second electronic devices 122 disposed in the bending area BA1a and the bending area BA1b. In this embodiment, since the widths of the bending area BA1a and the bending area BA1b in the first direction D1 are not the same as each other, the quantities of the electronic devices 120 disposed in the two bending areas are not the same as each other, either.

For example, the range of the bending area BA1a may cover two strings of electronic devices 120 connected in series by two second signal lines SL2, and the range of the bending area BA1b may cover only one string of electronic devices 120 connected in series by one second signal line SL2, but the disclosure is not limited thereto.

In this embodiment, the structure or properties of the first electronic devices 121 disposed in the non-bending area NBA are not different from those of the second electronic devices 122 disposed in the bending area BA1a and the bending area BA1b. Herein, the electronic devices 120 are simply distinguished as the first electronic devices 121 or the second electronic devices 122 based on the difference in the arrangement areas.

The connection configuration of the first signal line SL1 extending in the first direction D1 connecting with the first electronic device 121 in the non-bending area NBA is different from the connection configuration of the first signal line SL1 connecting with the second electronic device 122 in the bending area BA1a or the bending area BA1b. Specifically, two junctions between the first signal line SL1 and the first electronic device 121 are located on two opposite sides of the first electronic device 121 in the first direction D1. In contrast, two junctions between the first signal line SL1 and the second electronic device 122 are located on two opposite sides of the second electronic device 122 in the axial direction (e.g., the second direction D2) of the bending line BL1a or the bending line BL1b.

Since the device panel 10 of this embodiment is adaptable for bending along the bending line BL1a or the bending line BL1b in the first direction D1, with the connection configuration of the first signal line SL1 and the second electronic device 122 as described above, it is possible to significantly reduce the strain amount of the second electronic device 122 resulting from pulling by the first signal line SL1 in the bending area, to avoid damaging the second electronic device 122 and thus influencing the operational electrical properties.

On the other hand, the connection configuration of the second signal line SL2 extending in the second direction D2 connecting with the first electronic device 121 in the non-bending area NBA is substantially the same as the connection configuration of the second signal line SL2 connecting with the second electronic device 122 in the bending area BA1$a$ or the bending area BA1$b$. That is, two junctions between the second signal line SL2 and the first electronic device 121 and two junctions between the second signal line SL2 and the second electronic device 122 are both located on two opposite sides of the electronic device 120 in the second direction D2.

However, in this embodiment, a length L2 of a portion of a second signal line SL2-2 that extends in the bending area BA1$a$ or the bending area BA1$b$ and connects between two adjacent second electronic devices 122 may be less than a length L1 of a portion of a second signal line SL2-1 that extends in the non-bending area NBA and connects between two adjacent first electronic devices 121.

Specifically, in this embodiment, an orthographic projection onto the substrate 100 of the second signal line SL2-1 which connects a plurality of first electronic devices 121 in series along the second direction D2 has a bent shape, and an orthographic projection onto the substrate 100 of the second signal line SL2-2 which connects a plurality of second electronic devices 122 in series along the second direction D2 has a straight line shape.

Since the two junctions between the first signal line SL1 and the second electronic device 122 and the two junctions between the second signal line SL2-2 and the second electronic device 122 are both located on two opposite sides of the second electronic device 122 in the axial direction (i.e., the second direction D2) of the bending line, the straight-line design of the second signal line SL2-2 can increase the layout space of the first signal line SL1 on the two opposite sides of the second electronic device 122. However, the disclosure is not limited thereto. According to other embodiments, if the arrangement interval of the second electronic devices 122 along the second direction D2 is large enough, the second signal line located in the bending area may also adopt a bent circuit design.

Referring to FIG. 1 and FIG. 2A, in this embodiment, the thickness of one first signal line SL1 connecting a plurality of first electronic devices 121 and three second electronic devices 122 in series along the first direction D1 may vary in different areas. For example, the first signal line SL1 may have a first portion SL1$a$ and a second portion SL1$b$. Two first electronic devices 121 arranged adjacently along the first direction D1 may be connected in series by the first portion SL1$a$, and one first electronic device 121 and one second electronic device 122 arranged adjacently along the first direction D1 may be connected in series by the second portion SL1$b$. That is, the first portion SL1$a$ of the first signal line SL1 is located in the non-bending area NBA, and the second portion SL1$b$ of the first signal line SL1 extends from the non-bending area NBA to the bending area BA1$a$ or the bending area BA1$b$.

The junction of the first signal line SL1 connecting with the second electronic device 122 is located on one side of the second electronic device 122 in the axial direction of the bending line, and not on one side of the second electronic device 122 facing the adjacent first electronic device 121. Thus, the length of the second portion SL1$b$ of the first signal line SL1 is greater than the length of the first portion SL1$a$ of the first signal line SL1. To reduce the impedance difference resulting from the different lengths of the first portion SL1$a$ and the second portion SL1$b$ of the first signal line SL1, a thickness t1$b$ of the second portion SL1$b$ of the first signal line SL1 may be greater than a thickness t1$a$ of the first portion SL1$a$ of the first signal line SL1.

In this embodiment, the first signal line SL1 further has a third portion SL1$c$ located in the bending area BA1$a$, and the third portion SL1$c$ connects two second electronic devices 122 arranged adjacently along the first direction D1 in series. Two junctions between the third portion SL1$c$ and the respective two second electronic devices 122 are both located on one side of the two second electronic devices 122 in the axial direction of the bending line, and not on two opposite sides of the two second electronic devices 122 facing each other. Thus, the length of the third portion SL1$c$ of the first signal line SL1 is greater than the length of the second portion SL1$b$ of the first signal line SL1. To reduce the impedance difference resulting from the different lengths of the third portion SL1$c$ and the second portion SL1$b$ of the first signal line SL1, a thickness t1$c$ of the third portion SL1$c$ of the first signal line SL1 may be greater than the thickness t1$b$ of the second portion SL1$b$ of the first signal line SL1.

Referring to FIG. 1 and FIG. 2B, on the other hand, in this embodiment, since the length L2 of the portion of the second signal line SL2-2 that extends in the bending area BA1$a$ or the bending area BA1$b$ and connects between two adjacent second electronic devices 122 is less than the length L1 of the portion of the second signal line SL2-1 that extends in the non-bending area NBA and connects between two adjacent first electronic devices 121, a thickness t2-2 of the second signal line SL2-2 located in the bending area may be less than a thickness t2-1 of the second signal line SL2-1 located in the non-bending area NBA to reduce the impedance difference resulting from the different lengths of the second signal line SL2-1 and the second signal line SL2-2.

However, the disclosure is not limited thereto. Referring to FIG. 3, in a device panel 10A according to another modification embodiment, one signal line or different signal lines may adopt a design with a single thickness, but the widths may be different. For example, a width W1$b$ of a second portion SL1$b$-A of a first signal line SL1-A of the device panel 10A may be greater than a width W1$a$ of a first portion SL1$a$-A of the first signal line SL1-A, and a width W2-2 of a second signal line SL2A-2 located in the bending area may be less than a width W2-1 of a second signal line SL2A-1 located in the non-bending area NBA.

Some other embodiments will be described below to further illustrate the disclosure. The same components will be labeled with the same reference signs, and descriptions of the same technical contents will be omitted. Reference may be made to the embodiments above for the omitted descriptions, which will not be repeated below.

Figure 4:
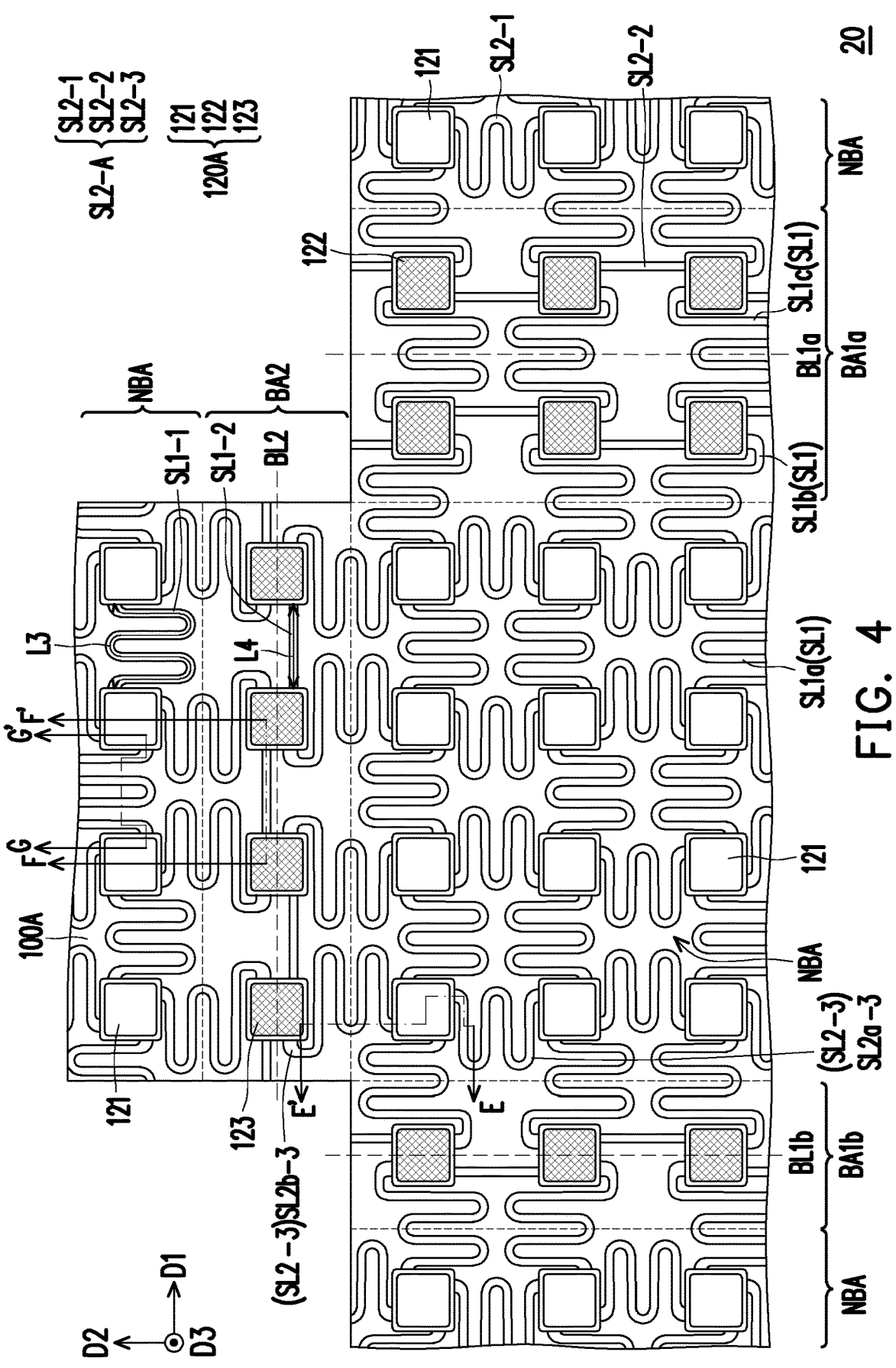
FIG. 4 is a schematic front view of a device panel according to a second embodiment of the disclosure.
Figures 5A, 5B:
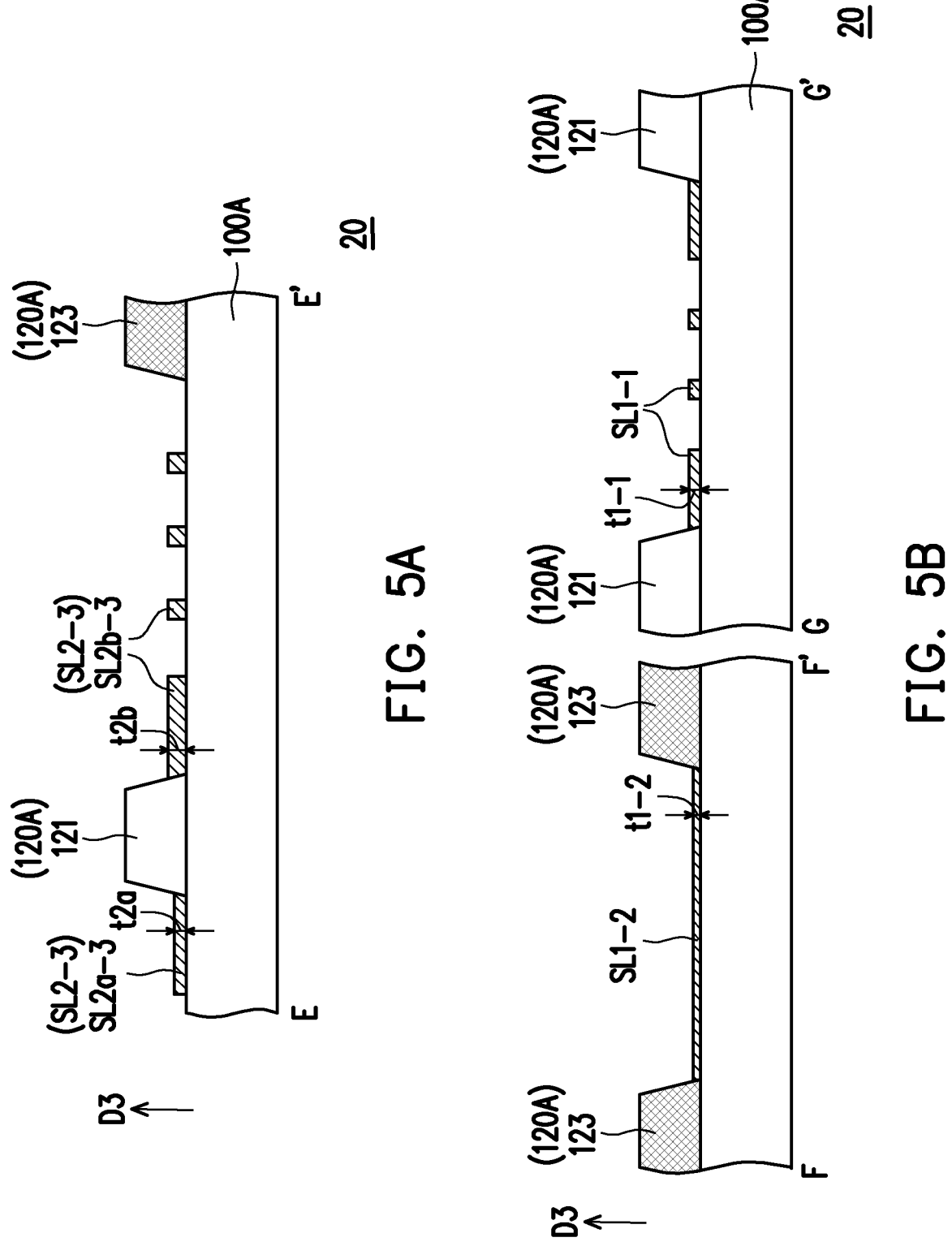
FIG. 5A and FIG. 5B are schematic cross-sectional views of the device panel in FIG. 4.
Figure 6:
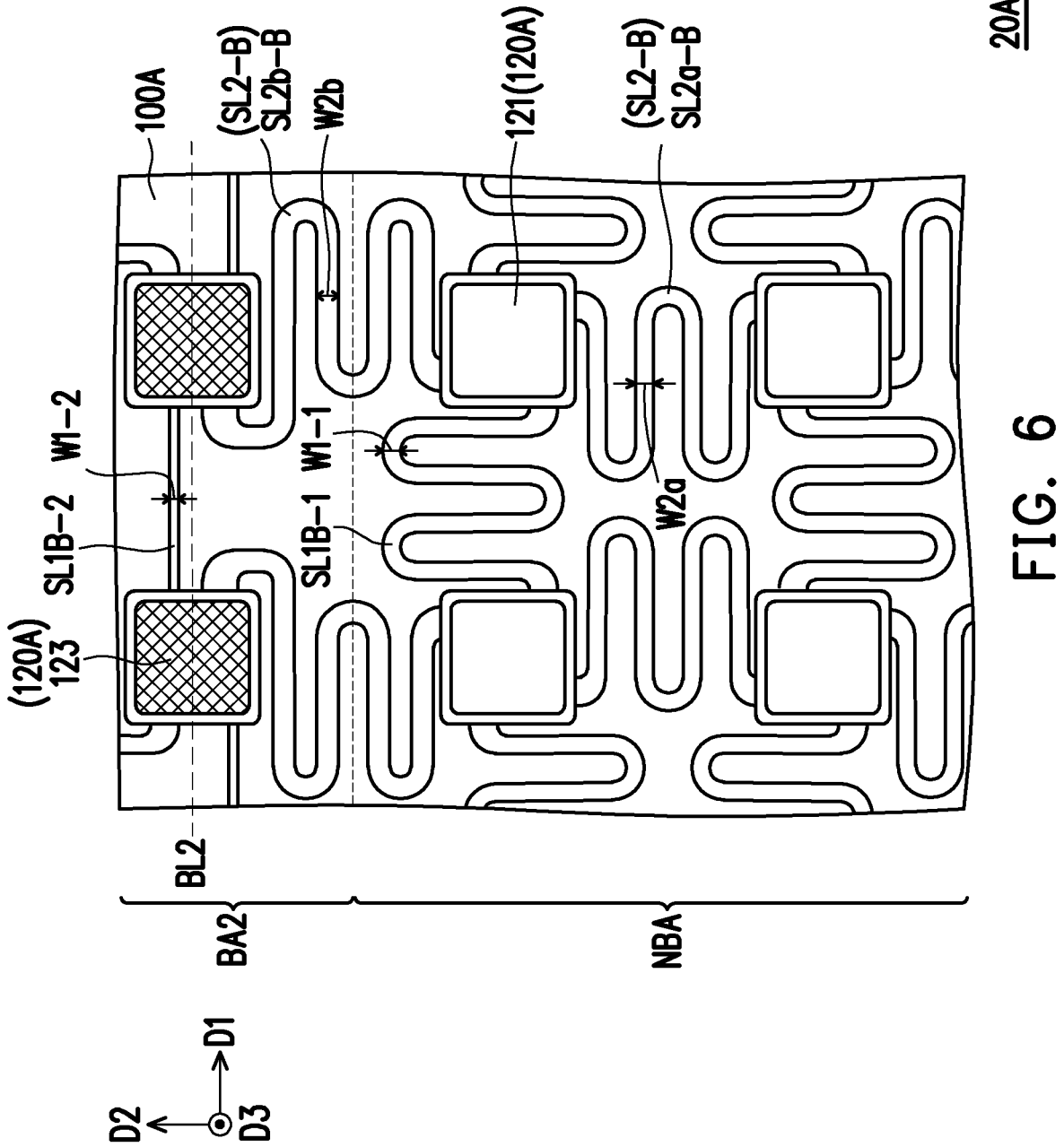
FIG. 6 is a schematic front view of another embodiment of the device panel in FIG. 4.

FIG. 4 is a schematic front view of a device panel according to a second embodiment of the disclosure. FIG. 5A and FIG. 5B are schematic cross-sectional views of the device panel in FIG. 4. FIG. 6 is a schematic front view of another embodiment of the device panel in FIG. 4. FIG. 5A corresponds to a sectional line E-E' in FIG. 4. FIG. 5B corresponds to a sectional line F-F' and a sectional line G-G' in FIG. 4.

Referring to FIG. 4, the difference between a device panel 20 of this embodiment and the device panel 10 in FIG. 1 lies in that the device panel 20 is further provided with a bending area BA2 (i.e., a second bending area) along the second direction D2, and a substrate 100A is adaptable for bending along a bending line BL2 (i.e., a second bending line) in the bending area BA2. In this embodiment, the bending line BL2 may optionally be parallel to the first direction D1, but is not limited thereto. That is, the bending line BL2 may intersect (for example, being perpendicular to) the bending line BL1$a$ and the bending line BL1$b$.

Furthermore, in this embodiment, a plurality of electronic devices 120A further include a plurality of third electronic devices 123 disposed in the bending area BA2. In this embodiment, the structure or properties of the first electronic devices 121 disposed in the non-bending area NBA are not different from those of the second electronic devices 122 disposed in the bending area BA1*a* and the bending area BA1*b* and the third electronic devices 123 disposed in the bending area BA2. Herein, the electronic devices 120A are simply distinguished as the first electronic devices 121, the second electronic devices 122, or the third electronic devices 123 based on the difference in the arrangement areas.

The connection configuration of a second signal line SL2-A extending in the second direction D2 connecting with the first electronic device 121 in the non-bending area NBA is different from the connection configuration of the second signal line SL2-A connecting with the third electronic device 123 in the bending area BA2. Specifically, two junctions between the second signal line SL2-A and the first electronic device 121 are located on two opposite sides of the first electronic device 121 in the second direction D2. In contrast, two junctions between the second signal line SL2-A and the third electronic device 123 are located on two opposite sides of the third electronic device 123 in the axial direction (e.g., the first direction D1) of the bending line BL2.

Since the device panel 20 of this embodiment is further adaptable for bending along the bending line BL2 in the second direction D2, with the connection configuration of the second signal line SL2-A and the third electronic device 123 as described above, it is possible to significantly reduce the strain amount of the third electronic device 123 resulting from pulling by the second signal line SL2-A in the bending area BA2, to avoid damaging the third electronic device 123 and thus influencing the operational electrical properties.

On the other hand, the connection configuration of the first signal line SL1 extending in the first direction D1 connecting with the first electronic device 121 in the non-bending area NBA is substantially the same as the connection configuration of the first signal line SL1 connecting with the third electronic device 123 in the bending area BA2. That is, two junctions between the first signal line SL1 and the first electronic device 121 and two junctions between the first signal line SL1 and the third electronic device 123 are both located on two opposite sides of the electronic device 120A in the first direction D1.

However, in this embodiment, a length L4 of a portion of a first signal line SL1-2 that extends in the bending area BA2 and connects between two adjacent third electronic devices 123 may be less than a length L3 of a portion of a first signal line SL1-1 that extends in the non-bending area NBA and connects between two adjacent first electronic devices 121.

Specifically, in this embodiment, an orthographic projection onto the substrate 100A of the first signal line SL1-1 which connects a plurality of first electronic devices 121 in series along the first direction D1 has a bent shape, and an orthographic projection onto the substrate 100A of the first signal line SL1-2 which connects a plurality of third electronic devices 123 in series along the first direction D1 has a straight-line shape.

Since the two junctions between the second signal line SL2-3 and the third electronic device 123 and the two junctions between the first signal line SL1-2 and the third electronic device 123 are both located on two opposite sides of the third electronic device 123 in the axial direction (i.e., the first direction D1) of the bending line BL2, the straight-line design of the first signal line SL1-2 can increase the layout space of the second signal line SL2-3 on the two opposite sides of the third electronic device 123. However, the disclosure is not limited thereto. According to other embodiments, if the arrangement interval of the third electronic devices 123 along the first direction D1 is large enough, the first signal line located in the bending area BA2 may also adopt a bent circuit design.

Referring to FIG. 4 and FIG. 5A, in this embodiment, the thickness of one second signal line SL2-3 connecting a plurality of first electronic devices 121 and one third electronic device 123 in series along the second direction D2 may vary in different areas. For example, the second signal line SL2-3 may have a first portion SL2*a*-3 and a second portion SL2*b*-3. Two first electronic devices 121 arranged adjacently along the second direction D2 may be connected in series by the first portion SL2*a*-3, and one first electronic device 121 and one third electronic device 123 arranged adjacently along the second direction D2 may be connected in series by the second portion SL2*b*-3. That is, the first portion SL2*a*-3 of the second signal line SL2-3 is located in the non-bending area NBA, and the second portion SL2*b*-3 of the second signal line SL2-3 extends from the non-bending area NBA to the bending area BA2.

The junction of the second signal line SL2-3 connecting with the third electronic device 123 is located on one side of the third electronic device 123 in the axial direction of the bending line BL2, and not on one side of the third electronic device 123 facing the adjacent first electronic device 121. Thus, the length of the second portion SL2*b*-3 of the second signal line SL2-3 is greater than the length of the first portion SL2*a*-3. To reduce the impedance difference resulting from the different lengths of the first portion SL2*a*-3 and the second portion SL2*b*-3 of the second signal line SL2-3, a thickness t2*b* of the second portion SL2*b*-3 of the second signal line SL2-3 may be greater than a thickness t2*a* of the first portion SL2*a*-3 of the second signal line SL2-3.

Referring to FIG. 4 and FIG. 5B, on the other hand, in this embodiment, since the length L4 of the portion of the first signal line SL1-2 that extends in the bending area BA2 and connects between two adjacent third electronic devices 123 is less than the length L3 of the portion of the first signal line SL1-1 that extends in the non-bending area NBA and connects between two adjacent first electronic devices 121, a thickness t1-2 of the first signal line SL1-2 located in the bending area BA2 may be less than a thickness t1-1 of the first signal line SL1-1 located in the non-bending area NBA to reduce the impedance difference resulting from the different lengths of the first signal line SL1-1 and the first signal line SL1-2.

However, the disclosure is not limited thereto. Referring to FIG. 6, in a device panel 20A according to another modification embodiment, one signal line or different signal lines may adopt a design with a single thickness, but the widths may be different. For example, a width W2*b* of a second portion SL2*b*-B of a second signal line SL2-B of the device panel 20A may be greater than a width W2*a* of a first portion SL2*a*-B of the second signal line SL2-B, and a width W1-2 of a first signal line SL1B-2 located in the bending area BA2 may be less than a width W1-1 of a first signal line SL1B-1 located in the non-bending area NBA.

In summary of the above, when the device panel according to an embodiment of the disclosure is bent along the bending line, since the junctions between the electronic devices and the signal lines in the bending area are all located on two opposite sides of the electronic devices in the axial direction of the bending line, it is possible to significantly reduce the strain amount of the electronic devices resulting from pulling by the signal lines in the bending area to thus improve stability of the operational electrical properties of the device panel.

What is claimed is:

1. A device panel comprising:

a substrate provided with a first bending area and a non-bending area outside the first bending area, the substrate being adaptable for bending along a first bending line in the first bending area;

a plurality of electronic devices disposed on the substrate, the electronic devices comprising:

a plurality of first electronic devices disposed in the non-bending area; and a plurality of second electronic devices disposed in the first bending area;

a plurality of first signal lines extending in a first direction and respectively connecting the electronic devices in series; and a plurality of second signal lines extending in a second direction and respectively connecting the electronic devices in series, the second direction intersecting the first direction, wherein the first bending line is perpendicular to the first direction, two junctions between any one of the second electronic devices and one of the first signal lines are located on two opposite sides of the any one of the second electronic devices in an axial direction of the first bending line, two adjacent second electronic devices among the second electronic devices that are arranged along the second direction are connected in series by one of the second signal lines, two adjacent first electronic devices among the first electronic devices that are arranged along the second direction are connected in series by another of the second signal lines, and a width of the one of the second signal lines is less than a width of the another of the second signal lines.

2. The device panel according to claim 1, wherein two junctions between any one of the first electronic devices and one of the first signal lines are located on two opposite sides of the any one of the first electronic devices in the first direction.

3. The device panel according to claim 1, wherein one of the first signal lines has a first portion and a second portion, two first electronic devices adjacent along the first direction among the first electronic devices are connected in series by the first portion, one of the first electronic devices and one of the second electronic devices are adjacent to each other and are connected in series by the second portion, and a thickness of the second portion is greater than a thickness of the first portion.

4. The device panel according to claim 1, wherein one of the first signal lines has a first portion and a second portion, two first electronic devices adjacent along the first direction among the first electronic devices are connected in series by the first portion, one of the first electronic devices and one of the second electronic devices are adjacent to each other and are connected in series by the second portion, and a width of the second portion is greater than a width of the first portion.

5. The device panel according to claim 1, wherein a thickness of the one of the second signal lines is less than a thickness of the another of the second signal lines.

6. The device panel according to claim 1, wherein an orthographic projection of the one of the second signal lines onto the substrate has a straight-line shape, and an orthographic projection of the another of the second signal lines onto the substrate has a bent shape.

7. The device panel according to claim 6, wherein a length of a portion of the one of the second signal lines between two adjacent second electronic devices among the second electronic devices that are connected with the one of the second signal lines is less than a length of a portion of the another of the second signal lines between two adjacent first electronic devices among the first electronic devices that are connected with the another of the second signal lines.

8. The device panel according to claim 1, wherein the substrate is further provided with a second bending area, the substrate is further adaptable for bending along a second bending line in the second bending area, the second bending line intersects the first bending line, the electronic devices further comprise a plurality of third electronic devices disposed in the second bending area, two adjacent first electronic devices among the first electronic devices that are arranged along the first direction are connected in series by one of the first signal lines, two adjacent third electronic devices among the third electronic devices that are arranged along the first direction are connected in series by another of the first signal lines, an orthographic projection of the one of the first signal lines onto the substrate has a bent shape, and an orthographic projection of the another of the first signal lines onto the substrate has a straight-line shape.

9. The device panel according to claim 8, further comprising:

a plurality of second signal lines extending in a second direction and respectively connecting the electronic devices in series, the second direction intersecting the first direction, wherein two junctions between any one of the third electronic devices and one of the second signal lines are located on two opposite sides of the any one of the third electronic devices in an axial direction of the second bending line.

10. The device panel according to claim 9, wherein two junctions between any one of the first electronic devices and one of the second signal lines are located on two opposite sides of the any one of the first electronic devices in the second direction.

11. The device panel according to claim 9, wherein one of the second signal lines has a first portion and a second portion, two adjacent first electronic devices among the first electronic devices that are arranged along the second direction are connected in series by the first portion, one of the first electronic devices and one of the third electronic devices are adjacent to each other and are connected in series by the second portion, and a thickness of the second portion is greater than a thickness of the first portion.

12. The device panel according to claim 9, wherein one of the second signal lines has a first portion and a second portion, two adjacent first electronic devices among the first electronic devices that are arranged along the second direction are connected in series by the first portion, one of the first electronic devices and one of the third electronic devices are adjacent to each other and are connected in series by the second portion, and a width of the second portion is greater than a width of the first portion.

13. The device panel according to claim 9, wherein a thickness of the another of the first signal lines is less than a thickness of the one of the first signal lines.

14. The device panel according to claim 9, wherein a width of the another of the first signal lines is less than a width of the one of the first signal lines.

15. The device panel according to claim 8, wherein a length of a portion of the another of the first signal lines between two adjacent third electronic devices among the third electronic devices that are connected with the another of the first signal lines is less than a length of a portion of the one of the first signal lines between two adjacent first electronic devices among the first electronic devices that are connected with the one of the first signal lines.

16. The device panel according to claim 1, wherein the electronic devices are a plurality of light-emitting devices.

* * * * *